United States Patent [19]

Schwartz et al.

[11] 3,828,344

[45] Aug. 6, 1974

[54] DOUBLE DENSITY TO NRZ CODE CONVERTER

[75] Inventors: William F. Schwartz, Marlton; Robert W. Butler, Cherry Hill, both of N.J.

[73] Assignee: GTE Information Systems, Incorporated, Moorestown, N.J. ; by said Schwartz

[22] Filed: Jan. 2, 1973

[21] Appl. No.: 320,454

[52] U.S. Cl. .......... 340/347 DD
[51] Int. Cl. .......... H03k 13/24
[58] Field of Search .......... 340/347 DD, 174.1 H

[56] References Cited

UNITED STATES PATENTS

| | | | |
|---|---|---|---|
| 3,508,228 | 4/1970 | Bishop | 340/174.1 H |
| 3,587,086 | 6/1971 | Chatelon | 340/347 DD |
| 3,623,041 | 11/1971 | MacDougall, Jr. | 340/347 DD |
| 3,671,960 | 6/1972 | Sollman et al. | 340/347 DD |
| 3,691,553 | 9/1972 | McIntosh | 340/347 DD |
| 3,697,977 | 10/1972 | Sollman et al. | 340/347 DD |
| 3,699,554 | 10/1972 | Jones | 340/347 DD |

*Primary Examiner*—Charles D. Miller
*Attorney, Agent, or Firm*—Peter Xiarhos; Elmer J. Nealon; Norman J. O'Malley

[57] ABSTRACT

A data converting apparatus for converting double density encoded signals to NRZ (non-return-to-zero) encoded signals. A double density encoded signal is gated into a first flip-flop by a first train of clock pulses and also into a second flip-flop by a second train of clock pulses phase displaced with respect to the first train of clock pulses. For each transition in the double density encoded signal from a first level to a second level, for example, from a low level to a high level, a first AND gate coupled to the two flip-flops produces an output pulse. For each transition in the double density encoded signal from the second level to the first level, that is, from the high level to the low level, a second AND gate coupled to the two flip-flops produces an output pulse. The output pulses produced by the two AND gates are inverted and combined by a NOR gate into a single pulse train and applied to a third flip-flop together with the second train of clock pulses. The pulse train applied by the NOR gate to the third flip-flop is delayed by a slight amount with respect to the second train of clock pulses due to propagation delays inherent in the data converting apparatus due to the presence of the first and second flip-flops, the AND gates, and the NOR gate.

The third flip-flop operates to sample the levels of the single pulse train received from the NOR gate at the times of occurrence of the leading edges of successive clock pulses in the second train of clock pulses. Each time that the pulse train received from the NOR gate is low at the time of occurrence of the leading edge of a clock pulse in the second train of clock pulses, the third flip-flop assumes a first state, for example a "1" state. Each time that the pulse train received from the NOR gate is high at the time of occurrence of the leading edge of a clock pulse in the second train of clock pulses, the third flip-flop assumes a second state, for example, a "0" state. The switching of the third flip-flop between its two states is determined by the levels of the pulse train received from the NOR gate at the times of occurrence of the leading edges of successive clock pulses in the second train of clock pulses.

6 Claims, 12 Drawing Figures

DOUBLE DENSITY TO NRZ CODE CONVERTER

BACKGROUND OF THE INVENTION

The present invention relates to a data converting apparatus and, more particularly, to a data converting apparatus for converting double density encoded signals to NRZ (non-return-to-zero) signals.

There are many applications, for example, in reading double density encoded signals stored on a bulk storage medium (e.g., a storage drum) in which it is desired to convert the double density encoded signals stored on the bulk storage medium into NRZ encoded signals for use by data processing circuitry. Generally, the relationship between the two types of encoded signals is as follows:

a. For each "1" bit in a bit period of an NRZ encoded signal, a transition occurs in a corresponding bit period of a double density encoded signal at the end of the corresponding bit period;

b. For each "0" bit in a bit period of the NRZ encoded signal, except where a "0 " bit follows a "1" bit, a transition occurs in a corresponding bit period of the double density encoded signal at the center of the corresponding bit period; and c. When a "0" bit of the NRZ encoded signal follows a "1" bit, no transition occurs in the corresponding bit period of the double density encoded signal.

The present invention is directed to a data converting apparatus for converting a double density encoded signal to an NRZ encoded signal wherein the two types of signals have the relationships indicated hereinabove.

BRIEF SUMMARY OF THE INVENTION

Briefly, in accordance with the present invention, a data converting apparatus is provided for converting a double density encoded signal into an NRZ encoded signal. The double density encoded signal comprises successive bit periods and includes transitions between first and second levels. The data converting apparatus in accordance with the invention includes a first means adapted to receive the double density encoded signal and first and second trains of pulses. The first and second trains of pulses comprise pulses each having a width equal to a fraction of a bit period of the double density encoded signal. In addition, the second train of pulses is phase displaced with respect to the first train of pulses by the aforesaid fraction of a bit period. The first means operates in response to the double density encoded signal and the first and second trains of pulses to produce an output signal for each transition in the double density encoded signal from the first level to the second level and to produce an output signal for each transition in the double density encoded signal from the second level to the first level.

A second means coupled to the first means receives the output signals produced by the first means and operates to combine these output signals into a single signal which includes signals corresponding to the output signals produced by the first means. A delay means operates to cause the signal produced by the second means to be delayed with respect to the second train of pulses by an amount less than the aforesaid fraction of a bit period. The delayed signal, together with the second train of pulses, is applied to a third means. The third means operates to sample the levels of the delayed signal at the times of occurrence of predetermined transitions (e.g., the leading edges) of the second train of pulses. In accordance with this sampling operation, an output having a first value is produced by the third means each time that the delayed signal is at a first level at the time of occurrence of an aforesaid transition in the second train of pulses, and an output having a second value is produced by the third means each time that the delayed signal is at a second level at the time of occurrence of an aforesaid transition in the second train of pulses. The combined outputs of the third means represent an NRZ encoded signal corresponding to the particular double density encoded signal received by the first means.

BRIEF DESCRIPTION OF THE DRAWING

Various objects, features, and advantages of a data converting apparatus in accordance with the present invention will be apparent from the following detailed discussion taken in conjunction with the accompanying drawing in which.

DETAILED DESCRIPTION OF THE INVENTION

Figure 1:
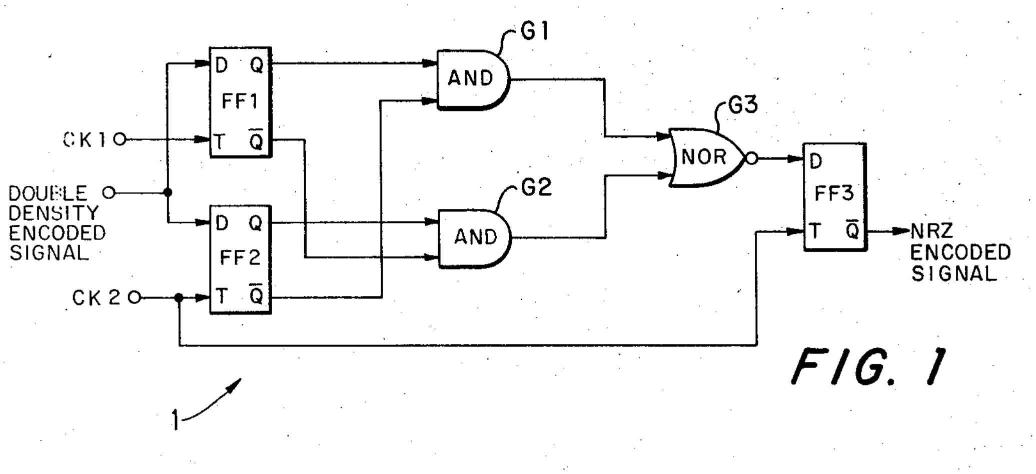
FIG. 1 is a schematic block diagram of a data converting apparatus in accordance with the present invention.
Figures 2A, 2B, 2C, 2D, 2E, 2F, 2G, 2H, 2I, 2J, 2K:
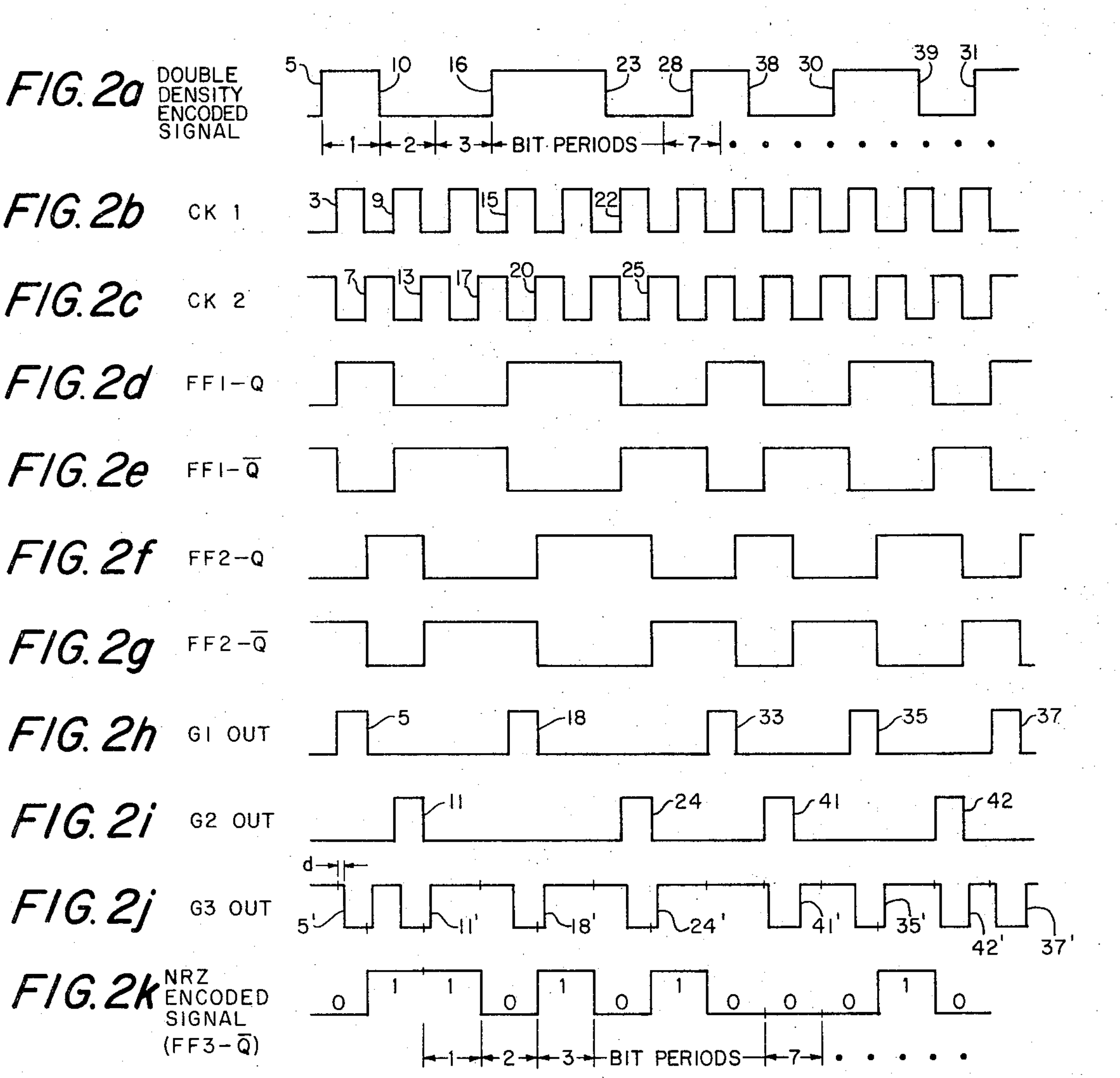
FIGS. 2(a)-2(k) are waveforms used to explain the data converting apparatus of FIG. 1.

Referring now to FIG. 1, there is shown a data converting apparatus 1 in accordance with the present invention. As shown in FIG. 1, the data converting apparatus 1 includes three flip-flops FF1, FF2, and FF3, a pair of AND gates G1 and G2, and a NOR gate G3. Each of the flip-flops FF1 and FF2 has a data input D, a trigger input T, a first output Q and a second output $\overline{Q}$. A double density encoded signal which is to be converted to an NRZ encoded signal by the data converting apparatus 1 of FIG. 1 is applied in common to the data inputs D of the flip-flops FF1 and FF2. An exemplary form of such a double density encoded signal is shown in FIG. 2(*a*). As shown in FIG. 2(*a*), the double density encoded signal is divided into successive bit periods and includes a plurality of positive-going and negative-going transitions the times of occurrence of which are detected by the data converting apparatus 1 to construct the desired NRZ encoded signal corresponding to the double density signal. The double density encoded signal is gated into the flip-flops FF1 and FF2, whereby the double density encoded signal is sampled by the flip-flops FF1 and FF2, by means of the leading edges of successive clock pulses of a CK1 pulse train applied to the trigger input T of the flip-flop FF1 and by means of the leading edges of successive clock pulses of a CK2 pulse train applied to the trigger input T of the flip-flop FF2. Typical forms of the CK1 and CK2 pulse trains are shown in FIGS. 2(*b*) and 2(*c*), respectively. As shown in FIGS. 2(*b*) and 2(*c*), the CK1 and CK2 pulse trains comprise pulses each having a width of one half of a bit period of the double density encoded signal, and the two pulse trains are phase displaced with respect to each other by 180°. As a result of the phase displacement, the double density encoded signal is gated into the flip-flop FF1 one pulse time in advance of the double density encoded signal being gated into the flip-flop FF2. It is also to be noted from FIGS. 2(*b*) and 2(*c*) that the timing for the CK1 and CK2 pulse trains is established with respect to the double density encoded signal such that the transitions of the double density encoded signal, both positive-going and negative-going transitions, coincide with the centers of pulses of the CK1 and CK2 pulse trains.

The first output Q of the flip-flop FF1 is coupled to a first input of the AND gate G1 and the other output $\overline{Q}$ is coupled to a first input of the AND gate G2. In a similar manner, the first output Q of the flip-flop FF2 is coupled to a second input of the AND gate G2 and the other output $\overline{Q}$ is coupled to a second input of the AND gate G1. The AND gate G1 is arranged to produce a positive output pulse having a width of one half bit period, such as shown in FIG. 2(*h*), whenever the output Q of the flip-flop FF1 and the output $\overline{Q}$ of the flip-flop FF2 are both high (positive) at the same time. As will be more readily apparent hereinafter, these conditions of the output Q of the flip-flop FF1 and the output $\overline{Q}$ of the flip-flop FF2 are achieved whenever a positive-going transition occurs in the double density encoded signal gated into the flip-flops FF1 and FF2 (via the data inputs D of the flip-flops FF1 and FF2). In a similar manner, the AND gate G2 is arranged to produce a positive output pulse having a width of one half bit period, such ao shown in FIG. 2(*i*), whenever the output Q of the flip-flop FF2 and the output $\overline{Q}$ of the flip-flop FF1 are both high (positive) at the same time. As will be more readily apparent hereinafter, these conditions of the output Q of the flip-flop FF2 and the output $\overline{Q}$ of the flip-flop FF1 are achieved whenever a negative-going transition occurs in the double density encoded signal gated into the flip-flops FF1 and FF2 (via the data inputs D of the flip-flops FF1 and FF2).

The NOR gate G3 operates to receive the positive output pulses produced by the AND gates G1 and G2, at first and second inputs thereof, and to invert and combine these pulses into a single pulse train, such as shown, for example, in FIG. 2(*j*). It is to be noted that these pulses are delayed by a very slight amount *d* with respect to the pulses of the CK1 and CK2 pulse trains of FIGS. 2(*b*) and 2(*c*), respectively. This delay *d* is due to the presence of propagation delays inherent in the data converting apparatus 1 due to the presence of the flip-flops FF1 and FF2 and the gates G1, G2 and G3 and is necessary to the proper operation of the data converting apparatus 1, as will be described in detail hereinafter. The delayed output pulses produced by the NOR gate G3 are applied to a data input D of the flip-flop FF3 while, at the same time, the CK2 pulse train is applied to a trigger input T of the flip-flop FF3. The flip-flop FF3 operates to sample the pulses applied to its data input D at the times of occurrence of the leading edges of the pulses of the CK2 pulse train. As a result, an output pulse train, such as shown, for example, in FIG. 2(*k*), is produced at an output $\overline{Q}$ of the flip-flop FF3 and includes "1" and "0" bits therein. The output pulse train produced at the output $\overline{Q}$ of the flip-flop FF3 represents an NRZ encoded signal corresponding to the particular double density encoded signal applied to the data inputs D of the flip-flops FF1 and FF2.

The operation of the data converting apparatus 1 of FIG. 1 will not be described in greater detail with particular reference being made to the double density encoded signal shown in FIG. 2(*a*). The double density encoded signal is applied to the data inputs D of the flip-flops FF1 and FF2 and loaded into the flip-flops to be sampled by the flip-flops on the leading edges of successive pulses in the CK1 and CK2 pulse trains. As mentioned previously, the double density encoded signal is first loaded into the flip-flop FF1 and, after a delay of one pulse time (one half bit period), then loaded into the flip-flop FF2. On the leading edge of the first clock pusle 3 of the CK1 pulse train, the first transition of the double density encoded signal, namely, a positive-going transition 5, causes the outputs Q and $\overline{Q}$ of the flip-flop FF1 to go high and low, respectively. At this time, the outputs Q and $\overline{Q}$ of the flip-flop FF2 are low and high, respectively. With the output Q of the flip-flop FF1 and the output $\overline{Q}$ of the flip-flop FF2 both high (positive) at the same time, a first output pulse 6 is produced by the AND gate G1. On the leading edge of the clock pulse 7 of the CK2 pulse train, the transition 5 in the double density encoded signal causes the outputs Q and $\overline{Q}$ of the flip-flop FF2 go high and low, respectively.

On the leading edge of the next clock pulse 9 of the CK1 pulse train, the next transition in the double density encoded signal, namely, a negative-going transition 10, causes the Q and $\overline{Q}$ outputs of the flip-flop FF1 to go low and high, respectively. At this time, the outputs Q and $\overline{Q}$ of the flip-flop FF2 are high and low, respectively. With the output Q of the flip-flop FF2 and the output $\overline{Q}$ of the flip-flop FF1 both high (positive) at the same time, an output pulse 11 is produced by the AND gate G2. On the leading edge of the next clock pulse 13 of the CK2 pulse train, the transition 10 in the double density encoded signal causes the outputs Q and $\overline{Q}$ of the flip-flop FF2 to go low and high, respectively.

On the leading edge of the clock pulse 15 of the CK1 pulse train, the next transition in the double density encoded signal, namely, a positive-going transition 16, causes the outputs Q and $\overline{Q}$ of the flip-flop FF1 to go high and low, respectively. At this time, the outputs Q and $\overline{Q}$ of the flip-flop FF2 are low and high, respectively. With the output $\overline{Q}$ of the flip-flop FF1 and the output Q of the flip-flop FF2 both high at the same time, another output pulse 18 is produced by the AND gate G1. On the leading edge of the clock pulse 20 of the CK2 pulse train, the transition 16 in the double density encoded signal causes the outputs Q and $\overline{Q}$ of the flip-flop FF2 to go high and low, respectively.

On the leading edge of the clock pulse 22 of the CK1 pulse train, the next transition in the double density encoded signal, namely, a negative-going transition 23, causes the outputs Q and Q of the flip-flop FF1 to go low and high, respectively. At this time, the outputs Q and Q of the flip-flop FF2 are high and low, respectively. With the output Q of the flip-flop FF2 and the output Q of the flip-flop FF1 both high at the same time, another output pulse 24 is produced by the AND gate G2. On the leading edge of the clock pulse 25 of the CK2 pulse train, the transition 23 in the double density encoded signal causes the outputs Q and Q of the flip-flop FF2 to go low and high, respectively.

The abovedescribed type of operation continues until all of the transitions in the double density encoded signal have been processed by the data converting apparatus 1. Specifically, the positive-going transitions 28, 30 and 31 in the double density encoded signal cause output pulses 33, 35 and 37 to be produced by the AND gate G1, and the negative-going transitions 38 and 39 in the double density encoded signal cause output pulses 41 and 42 to be produced by the AND gate G2. It is apparent, therefore, that an output pulse is produced by the AND gate G1 for each positive-going transition in the double density encoded signal and that an output pulse is produced by the AND gate G2 for each negative-going transition in the double density encoded signal. By virtue of the aforementioned timing relationship between the CK1 and CK2 pulse trains and the double density encoded signal, each of the output pulses produced by the AND gates G1 and G2 has a width equal to the width of a pulse in the CK1 and CK2 pulse trains, that is, one half bit period. The output pulses produced by the AND gates G1 and G2 are inverted and combined by the NOR gate G3 into a single output pulse train, FIG. 2(*j*). As shown in FIG. 2(*j*), the output pulse train produced by the NOR gate G3 including pulses 6', 11', 18', 24', 41', 35', 42', and 37' corresponding to the same numbered pulses produced by the AND gates G1 and G2. As mentioned previously, and as also shown in FIG. 2(*j*), the output pulse train produced by the NOR gate G3 is delayed with respect to the CK1 and CK2 pulse trains by an amount *d*. The significance of this delay will now be described in connection with the operation of the flip-flop FF3.

The flip-flop FF3 receives at its data input D the output pulse train produced by the NOR gate G3. In addition, the flip-flop FF3 receives the CK2 pulse train at its trigger input T. The flip-flop FF3 operates to sample the pulse train at its data input D on the leading edges of the pulses in the CK2 pulse train. Each time that the pulse train at the data input D of the flip-flop FF3 is low, that is, negative, at the time of occurrence of a leading edge of a pulse in the CK2 pulse train, the flip-flop FF3 produces a signal at its output $\overline{Q}$ which is high (that is, positive). This high signal represents the "1" state of the flip-flop FF3. Each time that the pulse train is high, that is, positive, at the time of occurrence of a leading edge of a pulse train in the CK2 pulse train, the flip-flop FF3 produces a signal at its output $\overline{Q}$ which is low (that is, negative). This low signal reprsents the "0" state of the flip-flop FF3. The switching of the flip-flop FF3 between its "1" and "0" states is determined by the levels of the pulse train at its data input D at the times of occurrence of the leading edges of successive ones of the pulses in the CK2 pulse train. Specifically, if the level of the pulse train at the data input D of the flip-flop FF3 at the time of occurrence of the leading edge of one pulse in the CK2 pulse train is low (negative) and, at the time of occurrence of the leading edge of the next pulse in the CK2 pulse train, the level of the pulse train is high (positive), the flip-flop FF3 switches from its "1" state to its "0" state. Similarly, if the level of the pulse train at the data input D of the flip-flop FF3 at the time of occurrence of the leading edge of one pulse in the CK2 pulse train is high and, at the time of occurrence of the leading edge of the next pulse in the CK2 pulse train, the level of the pulse train is low, the flip-flop FF3 switches from its "0" state to its "1" state. If no change should take place in the levels of the pulse train between these two times, no change takes place in the state of the flip-flop FF3.

Referring now to FIGS. 2(*c*) and 2(*j*), it will be readily seen that at the time of occurrence of the leading edge of the pulse 7 in the CK2 pulse train, the pulse train at the data input D of the flip-flop FF3 is low and the flip-flop FF3 assumes its "1" state. At the time of occurrence of the leading edge of the next pulse 13 in the CK2 pulse train, the pulse train at the data input D of the flip-flop FF3 is still low and the flip-flop FF3 accordingly remains in its "1" state. At the time of occurrence of the leading edge of the next pulse 17 in the CK2 pulse train, the pulse train at the data input D of the flip-flop FF3 becomes high and, as a result, the flip-flop FF3 switches to its "0" state. At the time of occurrence of the leading edge of the next pulse 20 in the CK2 pulse train, the pulse train at the data input D of the flip-flop FF3 becomes low again and, as a result, the flip-flop FF3 switches back to its "1" state. The above action continues whereby the flip-flop FF3 produces additional "1" to "0" and "0" to "1" transitions defining additional "1" and "0" bits in the output signal at its output $\overline{Q}$. The resultant output signal, representing an NRZ encoded signal, is shown in FIG. 2(*k*). It is to be noted in connection with the NRZ encoded signal produced at the output $\overline{Q}$ of the flip-flop FF3 that if the pulse train at the data input D of the flip-flop FF3 were not delayed with respect to the CK2 pulse train, the leading edges of the pulses in the CK2 pulse train would not coincide with the high and low levels of the pulse train but rather would coincide with the transitions in the pulse train. As a result, the flip-flop FF3 would be unable to reliably distinguish between the two levels of the pulse train and improper transitions would be produced in the NRZ encoded signal produced at the output $\overline{Q}$ of the flip-flop FF3. Thus, the delay d in the pulse train is necessary to the proper operation of the data converting apparatus 1. To further insure proper operation of the data converting apparatus 1, the delay *d* should not exceed one-half of a bit period. For conventional flip-flops and logic gates (e.g., of the TTL type) this condition is easily achieved.

A comparison of the waveforms of FIGS. 2 (*a*) and 2 (*k*) will now demonstrate that the aforedescribed relationship between NRZ encoded signals and double density encoded signals are satisfied. Considering bit periods 1, 2, and 7, for example, of the NRZ encoded signal produced at the output Q of the flip-flop FF3, it will be seen that for the "1" bit in bit period 1 of the NRZ encoded signal a transition occurs at the end of the corresponding bit period 1 in the double density encoded signal; for the "0" bit in bit period 2 of the NRZ encoded signal, no transition occurs at the end of the corresponding bit period 2 in the double density encoded signal; and for the "0" bit in bit period 7 of the NRZ encoded signal (which follows another "0" bit), a transition occurs at the center of the corresponding bit period 7 in the double density encoded signal.

While there has been described what is considered a preferred embodiment of the invention, it will be apparent to those skilled in the art that various changes and modifications may be made therein without departing from the invention as set forth in the appended claims.

What is claimed is:

1. A data converting apparatus for converting a double density encoded signal into an NRZ encoded signal, said double density encoded signal comprising successive bit periods and including transitions between first and second levels, said data converting apparatus comprising:

first means having first and second output connections and adapted to receive a double density encoded signal and first and second trains of pulses, said first and second trains of pulses comprising pulses each having a width equal to a fraction of a bit period of the double density encoded signal and said second train of pulses being phase displaced with respect to the first train of pulses by said fraction of a bit period, said first means being operative in response to the double density encoded signal and the first and second trains of pulses to produce an output signal at its first output connection for each transition in the double density encoded signal from the first level to the second level and to produce an output signal at its second output connection for each transition in the double density encoded signal from the second level to the first level;

second means coupled to the first and second output connections of the first means and having an output connection said second means being operative to combine the output signals produced at the first and second output connections of the first means into a single signal at its output connection, said single signal including signals corresponding to the output signals produced at the first and second output connections of the first means;

delay means operative to cause the signal produced by the second means to be delayed with respect to the second train of pulses by an amount less than the aforesaid fraction of a bit period; and third means adapted to receive the delayed signal and the second train of pulses, said third means being operative to sample the levels of the delayed signal at the times of occurrence of predetermined transitions of the second train of pulses and to produce an output having a first value each time that the delayed signal is at a first level at the time of occurrence of an aforesaid transition in the second train of pulses and to produce an output having a second value each time that the delayed signal is at a second level at the time of occurrence of an aforesaid transition in the second train of pulses.

2. A data converting apparatus in accordance with claim 1 wherein the first means comprises:

a first flip-flop having a data input adapted to receive the double density encoded signal and a trigger input adapted to receive the first train of pulses; and a second flip-flop having a data input adapted to receive the double density encoded signal and a trigger input adapted to receive the second train of pulses.

3. A data converting apparatus in accordance with claim 2 wherein:

the first flip-flop has a first output and a second output;

the second flip-flop has a first output and a second output; and the first means further comprises:

a first AND gate having a first input coupled to the first output of the first flip-flop, a second input coupled to the second output of the second flip-flop, and an output; and a second AND gate having a first input coupled to the first output of the second flip-flop, a second input coupled to the second output of the first flip-flop, and an output.

4. A data converting apparatus in accordance with claim 3 wherein:

the second means includes a NOR gate having a first input coupled to the output of the first AND gate, a second input coupled to the output of the second AND gate, and an output.

5. A data converting apparatus in accordance with claim 4 wherein the third means comprises:

a third flip-flop having a data input adapted to receive the delayed signal and a trigger input adapted to receive the second train of pulses.

6. A data converting apparatus in accordance with claim 5 wherein:

the first and second trains of pulses each include pulses each having a width equal to one-half of a bit period of the double density encoded signal; and the second train of pulses is phase displaced with respect to the first train of pulses by one half of a bit period.

* * * * *